United States Patent
Eu et al.

(10) Patent No.: US 7,378,478 B2
(45) Date of Patent: May 27, 2008

(54) CATALYST PRECURSOR COMPOSITION FOR ELECTROLESS PLATING, AND PREPARATION METHOD OF TRANSPARENT ELECTROMAGNETIC INTERFERENCE SHIELDING MATERIAL USING THE SAME

(75) Inventors: Seung-Hun Eu, Daejeon (KR); Jang-Hoon Lee, Daegu (KR)

(73) Assignee: LG Chem Ltd. (KR)

( * ) Notice: Subject to any disclaimer, the term of this patent is extended or adjusted under 35 U.S.C. 154(b) by 0 days.

(21) Appl. No.: 10/900,622

(22) Filed: Jul. 28, 2004

(65) Prior Publication Data

US 2005/0022692 A1 Feb. 3, 2005

(30) Foreign Application Priority Data

Jul. 29, 2003 (KR) .................. 10-2003-0052425

(51) Int. Cl.
*C08F 20/06* (2006.01)

(52) U.S. Cl. ............... 526/317.1; 526/318; 502/103; 502/125; 502/172

(58) Field of Classification Search ............... 502/159, 502/150, 155, 172, 103, 125; 427/443, 558, 427/304, 305, 443.1; 428/457; 174/35; 526/317.1, 318

See application file for complete search history.

(56) References Cited

U.S. PATENT DOCUMENTS

| | | | | |
|---|---|---|---|---|
| 4,017,545 A * | 4/1977 | Sauer et al. | ................ | 568/31 |
| 5,411,795 A | 5/1995 | Silverman | ................ | 428/229 |
| 5,610,250 A * | 3/1997 | Veregin et al. | ........... | 526/219.3 |
| 5,919,834 A * | 7/1999 | Downs et al. | ................ | 522/33 |
| 6,090,236 A * | 7/2000 | Nohr et al. | ............... | 156/275.5 |
| 6,136,412 A * | 10/2000 | Spiewak et al. | ............ | 428/143 |
| 6,197,408 B1 * | 3/2001 | Kanbara et al. | ............ | 428/209 |
| 6,207,266 B1 * | 3/2001 | Kanbara et al. | ............ | 428/323 |
| 6,210,537 B1 * | 4/2001 | Murphy et al. | ........ | 204/157.15 |
| 6,210,787 B1 * | 4/2001 | Goto et al. | ............. | 428/301.4 |
| 6,232,417 B1 * | 5/2001 | Rhodes et al. | ............. | 526/171 |
| 6,242,057 B1 * | 6/2001 | Nohr et al. | ................. | 427/513 |
| 6,261,671 B1 * | 7/2001 | Asai et al. | .................. | 428/206 |

(Continued)

FOREIGN PATENT DOCUMENTS

EP 0 506 993 A1 10/1992

(Continued)

OTHER PUBLICATIONS

"Noble Metal Solid Sols In Poly (Methyl Methacrylate)"; Author: Yukimichi Nakao; Journal of Colloid and Interface Science 171, pp. 386-391 (1995).

(Continued)

*Primary Examiner*—Ling-Sui Choi
(74) *Attorney, Agent, or Firm*—Cantor Colburn LLP

(57) ABSTRACT

The present invention relates to a catalyst precursor composition for electroless plating, and more specifically, the present invention provides the catalyst precursor composition comprising (a) a reactive oligomer; (b) a reactive monomer; (c) a photoinitiator; (d) a catalyst precursor for electroless plating; and (e) a solvent, and a method of preparing the EMI shielding material with the same.

The present invention provides an easy and simple method of preparing the EMI shielding material by using the catalyst precursor composition that contains a UV curable resin with good adhesion to the base material, thereby eliminating the need for pre-treating the base material with a receptive layer before electroless plating.

5 Claims, 2 Drawing Sheets

U.S. PATENT DOCUMENTS

| | | |
|---|---|---|
| 6,265,458 B1 * | 7/2001 | Nohr et al. .................... 522/6 |
| 6,451,932 B1 * | 9/2002 | Wang et al. ................. 525/523 |
| 6,479,706 B1 * | 11/2002 | Santobianco et al. ....... 568/332 |
| 6,579,664 B2 * | 6/2003 | Hu et al. .................. 430/284.1 |
| 6,599,681 B2 * | 7/2003 | Gilson ........................ 430/321 |
| 6,613,495 B2 * | 9/2003 | Shelnut ................... 430/280.1 |
| 6,677,175 B2 * | 1/2004 | Zhao et al. .................... 438/31 |
| 6,723,486 B2 * | 4/2004 | Goodall et al. .......... 430/270.1 |
| 6,747,101 B2 * | 6/2004 | Roth et al. .................. 525/531 |
| 6,780,566 B2 * | 8/2004 | Hu et al. .................. 430/284.1 |
| 6,818,153 B2 * | 11/2004 | Burnell-Jones ........ 252/301.36 |
| 6,849,109 B2 * | 2/2005 | Yadav et al. ............. 106/31.13 |
| 6,911,235 B2 * | 6/2005 | Frances et al. ............. 427/387 |
| 6,929,863 B2 * | 8/2005 | Frances ...................... 428/446 |
| 2002/0006558 A1 | 1/2002 | Kobayashi et al. ............ 430/7 |
| 2002/0132042 A1 * | 9/2002 | Merricks et al. .............. 427/98 |

FOREIGN PATENT DOCUMENTS

| | | |
|---|---|---|
| JP | 63200593 A | 8/1988 |
| JP | 07030227 A | 1/1995 |
| JP | 10140363 | 5/1998 |
| JP | 2000-311527 | 11/2000 |
| JP | 2001-177292 | 6/2001 |
| JP | 2001303255 A | 10/2001 |
| JP | 2002-185184 | 6/2002 |

OTHER PUBLICATIONS

Japanese Office Action dated Aug. 28, 2007 for Application No. 2005-518227 (All references cited in the Office Action are listed above).

Jackson, R.L.; "Pd+2/Poly(acrylic acid) Thin Films as Catalysts for Electroless Copper Deposition: Mechanism of Catalyst Formation"; J. Electrochem. Soc.; vol. 137, No. 1; pp. 95-101; Jan. 1990.

* cited by examiner

CATALYST PRECURSOR COMPOSITION FOR ELECTROLESS PLATING, AND PREPARATION METHOD OF TRANSPARENT ELECTROMAGNETIC INTERFERENCE SHIELDING MATERIAL USING THE SAME

BACKGROUND OF THE INVENTION (a) Field of the Invention

The present invention relates to a catalyst precursor composition for electroless plating, and a method of preparing transparent electromagnetic interference shielding material (hereinafter, referred to as "EMI" shielding material) using the same. More specifically, the catalyst precursor composition includes a UV (ultraviolet) curable resin with excellent adhesiveness to a base material, thereby eliminating the need for an additional pre-treatment in preparing the EMI shielding material. Thus, the present invention provides a catalyst precursor composition to easily prepare the EMI shielding material, and a preparation method for EMI shielding material using the same.

(b) Description of the Related Art

A plasma display panel (hereinafter referred to as "PDP") has an electrode providing a whole surface of a front glass thereof with signals and electric power, which produces much electromagnetic radiation in operation compared to other display devices.

Thus, it is necessary for the PDP to be equipped with a filter for shielding harmful electromagnetic waves generated in operating the PDP. The filter consists of several films laminated on glass, such as an anti-reflection film (hereinafter referred to as "AR film"), a near infrared ray shield film (hereinafter referred to as "NIR film"), a Neon-cut film, an EMI shield film, etc.

The EMI shielding material with good transparency is preferable to enable penetration of visible light. The EMI shielding material can be prepared by adhering conductive metals such as Copper, Silver, and Nickel on a transparent base material in a lattice pattern. The adhering methods of conductive metals on a substrate are classified into a dry method including a sputtering method and vacuum deposition, and a wet method including electroless plating, etc. Because the dry method requires expensive manufacturing equipments, the inexpensive wet method is most widely used.

In the electroless plating method, the plating reaction is initiated by contacting a plating solution with a catalyst, and thus metal is only plated on the catalyst. Printing of the catalyst on the transparent base material in a lattice pattern and then performing electroless plating produces the transparent EMI shielding material.

In general, because a catalyst for electroless plating is prepared in water, it is not easily adhered to the base material which is smooth and hydrophobic. Thus, the base material must be pre-treated to increase its surface roughness and hydrophilic properties by etching, etc. However, the pre-treatment cause a lack of uniformity and visibility in the base material surface.

Japanese Laid-Open Publication No. 2000-311527 discloses a method of preparing a transparent conductive film by printing a resin composition containing a catalyst for electroless plating on a base material to form a pattern, and then forming a conductive metal layer on the pattern by an electroless plating method. The method is advantageous in that it easily provides various kinds of patterned metal layers. However, an electroless catalyst must be obtained through a complicated process, and a layer that is receptive to the resin composition must be made on the surface of the base material before electroless plating takes place.

Japanese Laid-Open Publication No. 2001-177292 discloses a method of preparing the transparent conductive film by coating a hydrophobic transparent resin including a catalyst for electroless plating on the base material, and then performing electroless plating. The transparent metal pattern is obtained by performing electroless plating after coating a plating-resist compound on the resin layer, or by coating a photoresist compound on the electroless plated surface, irradiating light through a photomask, and then etching. In most cases, hydrophobic resins are used to adhere to the hydrophobic base material, but the method has a problem in that a transparent conductive film with high endurance cannot be obtained due to low adhesiveness. In addition, the process of shaping the metal pattern is complicated, requires expensive devices such as a photomask, and uses a non-aqueous plating solution, thereby increasing the production costs.

Japanese Laid-Open Publication No. 2002-185184 discloses a method of preparing the transparent EMI shielding material by printing a resin composition containing an electroless plating catalyst on a base material in a lattice pattern, and then performing electroless plating. In this case, a transparent pattern is made by a printing method, thereby requiring no expensive devices such as a photomasking machine, but a base material must be pre-treated with a receptive layer or an anchoring layer before plating in order to easily adhere the resin composition to the base material. In particular, it takes about three days to cure an anchoring layer coated by a two-component solution, thereby making it difficult to apply to the practical field.

SUMMARY OF THE INVENTION

A motivation of the present invention is to solve the above-described and other problems. It is an object of the present invention to provide a catalyst precursor composition for electroless plating comprising a UV (ultraviolet) curable resin with good adhesion to a base material, for easily preparing an EMI shielding material without additional pre-treatment of a base material.

It is another object of the present invention to provide a method of preparing an EMI shielding material using the catalyst precursor composition.

It is still another object of the present invention to provide an EMI shielding material prepared according to the method of the present invention.

It is still another object of the present invention to provide a PDP filter containing the EMI shielding material.

It is another object of the present invention to provide a PDP containing the PDP filter.

BRIEF DESCRIPTION OF THE DRAWINGS

The present invention will become more apparent by describing embodiments thereof in detail with reference to the accompanying drawings, in which.

DETAILED DESCRIPTION OF THE PREFERRED EMBODIMENTS

Figure 1:
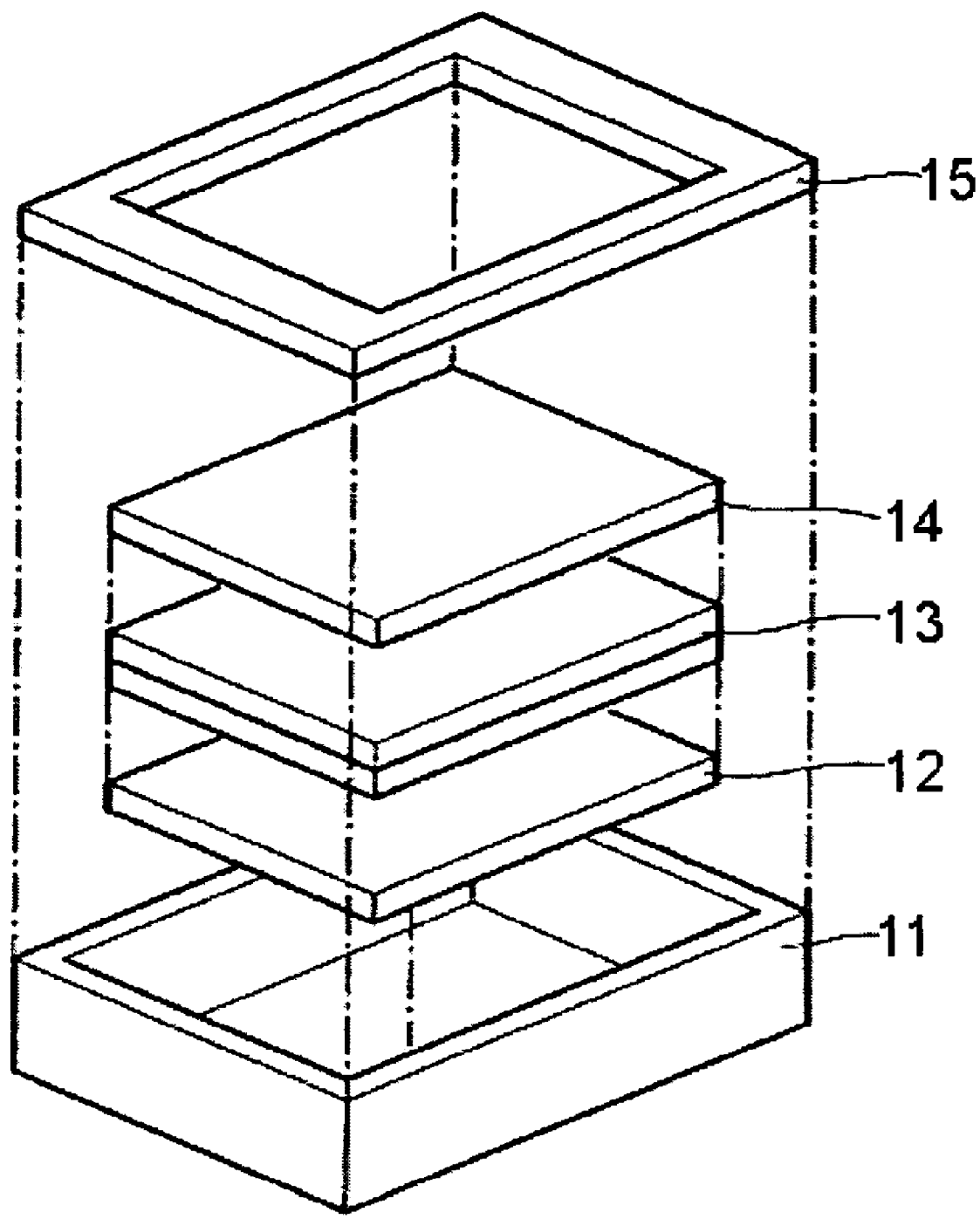
FIG. 1 is a layout view of a PDP according to an embodiment of the present invention.

The present invention relates to a catalyst precursor composition comprising (a) a reactive oligomer; (b) a reactive monomer; (c) a photoinitiator; (d) a catalyst precursor for electroless plating; and (e) a solvent.

The present invention relates to a method of preparing a transparent EMI shielding material by printing a catalyst precursor composition on a transparent base material in a lattice pattern, curing it with UV (ultraviolet) irradiation, and electroless plating the cured surface.

The present invention relates to a transparent EMI shielding material prepared according to the method of the present invention.

Hereinafter, the present invention is described in more detail.

The present inventors worked to develop a catalyst precursor composition with high adhesiveness to a base material without the need for pre-treatment of the base material, thereby offering a simple production method of EMI shielding material, and lowering the production cost thereof.

In doing so, the present inventors discovered a catalyst precursor composition for electroless plating by dissolving an organic compound or an inorganic compound including a group VIII B or a group I B metal as a catalyst precursor in a solvent, and then printing a UV curable resin with excellent adhesion on a base material. In addition, the present inventors discovered that the transparent EMI shielding material is prepared by the catalyst precursor composition, because the addition of the UV curable resin with high adhesiveness to the base material eliminates the need for pre-treatment of the base material.

The catalyst precursor composition for electroless plating comprises (a) a reactive oligomer; (b) a reactive monomer; (c) a photoinitiator; (d) a catalyst precursor for electroless plating; and (e) a solvent.

The transparent conductive film is prepared by printing the catalyst precursor composition on a base material in a lattice pattern, drying it, curing it with UV irradiation, and performing electroless plating. In these processes, the catalyst precursor dissolved in the composition is transformed into a catalyst suitable for electroless plating through a reaction initiated by UV irradiation.

The catalyst precursor exists in ion form in the composition, and is thus also referred to as "catalyst precursor ion ($M^{n+}$)." Examples of the catalyst includes Co, Rh, Ir, Ni, Pd, Pt, Cu, Ag, and Au. The photoinitiator is transformed to a radical by irradiating the catalyst precursor composition with UV, and then reducing the catalyst precursor ion to a metal element ($M^0$) which is suitable for the electroless plating.

In addition, the present invention has an advantage in that the catalyst precursor composition contains UV curable resin with good adhesion to the base material, thereby eliminating a need of pre-treating the base material with a receptive layer before electroless plating.

Hereinafter, each component of the catalyst precursor composition will be described.

In the catalyst precursor composition of the present invention, the (a) reactive oligomer determines the basic physicochemical characteristics of the catalyst precursor composition, such as reactivity, viscosity, surface gloss, adhesiveness, and resistance to chemicals and contamination.

In the catalyst precursor composition of the present invention, the reactive oligomer preferably uses a material having acrylate or methacrylate as a functional group. As examples, the reactive oligomer includes urethane acrylate, urethane diacrylate, urethane triacrylate, urethane methacrylate, epoxy acrylate, epoxy diacrylate, polyester acrylate, acrylic acrylate, or mixtures thereof, but is not limited thereto.

Preferably, the reactive oligomer has a molecular weight ranging from 500 to 5000. The amount of reactive oligomer can be determined depending on the printing method. The reactive oligomer is contained at 5 to 50 wt %, preferably 20-45 wt %, with respect to total weight of the catalyst precursor composition.

The (b) reactive monomer is contained in the catalyst precursor composition of the present invention in order to provide easy workability by lowering the viscosity of the reactive oligomer. In addition, the reactive monomer becomes a part of the cured material by participating in a cross-linking reaction.

The reactive monomer uses a material having acrylate or methacrylate as a functional group, for example, isobornyl acrylate, octyl acrylate, decyl acrylate, 1,6-hexanediol diacrylate, dipropylene glycol diacrylate, tripropylene glycol diacrylate, triethylene glycol diacrylate, tetraethylene glycol diacrylate, ethoxylated neopentyl glycol diacrylate, propoxylated neopentyl glycol diacrylate, 2-phenoxyethyl acrylate, propoxylated glyceryl triacrylate, ethoxylated trimethylolpropane triacrylate, pentaerythritol triacrylate, and mixtures thereof.

Preferably, the reactive monomer has the molecule weight ranging from 100 to 600. The amount of the reactive monomer can be determined depending on the printing method. The reactive monomer can be contained in the amount of 10 to 55 wt %, more preferably 25 to 45 wt %, with respect to the total weight of the catalyst precursor composition.

In the present invention, the reactive oligomer and the reactive monomer having acrylate or methacrylate as a functional group can be used for accelerating the reduction reaction from catalyst precursor ion ($M^{n+}$) to catalyst precursor element ($M^0$) (R. L. Jackson, J. Electrochem. Soc. 1990, 137(1), 95.; Y. Nakao, J. Colloid Interface Sci. 1995, 171, 386).

In addition, the catalyst precursor composition of the present invention contains the (c) photoinitiator, which is dissociated to radicals by UV irradiation, and initiates the cross-linking reaction of the UV curable resin.

In addition to the basic function of the photoinitiator, the photoinitiator in the present invention reduces the catalyst precursor ion ($M^{n+}$) in the catalyst precursor composition to the catalyst precursor element ($M^0$), which acts as a catalyst of the electroless plating reaction.

As examples, the photoinitiator is α-hydroxyketone, phenylglyoxylate, benzildimethyl ketal, α-aminoketone, monoacylphosphine, bisacylphosphine, and mixtures thereof.

The reduction rate of the catalyst precursor ion ($M^{n+}$) to the element ($M^0$) is dependent upon the kind of photoinitiator used. In general, α-hydroxyketone has the highest reduction rate, although the rate is somewhat different depending on the kinds of the reactive oligomer and the reactive monomer.

The amount of the photoinitiator in the catalyst precursor composition ranges from 1.5 to 6.0 wt %, more preferably 2.5 to 4.0 wt %, with respect to the catalyst precursor composition excluding the solvent.

In addition, the (d) catalyst precursor for electroless plating is an organic compound or inorganic compound of a group VIII B element or a group I B element.

In consideration of the solubility of the catalyst precursor in the solvent, it is preferable to use an organic compound, and most preferably the salt of an organic compound with a carbonyl or olefin group including $Pd^{2+}$, such as palladium acetate, palladium trifluoroacetate, palladium oxalate, palladium acetylacetonate, etc.

In a certain range, the reaction rate of electroless plating is proportional to the amount of catalyst. The organic or inorganic compound of the group VIII B metal or the group I B metal is very expensive, and thus it is important to optimize the amount of the compound. In particular, although the content of the compound is somewhat different depending on the kind of electroless plating, the catalyst precursor content is preferably 0.2 to 6.0 wt %, more preferably 0.4 to 3.0 wt % with respect to the catalyst precursor composition excluding the solvent.

In addition, the (e) solvent in the catalyst precursor composition is not particularly limited, and can be a solvent generally used in the industrial field. Preferably, the solvent is an organic compound which is not capable of participating in the cross-linking reaction and which exists in a liquid phase at room temperature and 1 atmosphere. The viscosity and surface tension of the solvent are not specifically limited. However, the solvent needs good solubility to the catalyst precursor and photoinitiator, it should mix well with the reactive oligomer and the reactive monomer, and have a boiling point of 60-85° C. at 1 atmosphere. A solvent with a boiling point of less than 60° C. can be used, but it has safety problems.

Examples satisfying the solvent requirements include chloroform, acetonitrile, methylethylketone, ethylacetate, and mixtures thereof.

The amount of solvent ranges from 20 to 45 wt %, more preferably 30 to 40 wt %, with respect to the total weight of the catalyst precursor composition.

A method of preparing an EMI shielding material with the catalyst precursor composition as described above can be summarized as the steps of printing the catalyst precursor composition in a lattice pattern, heating it, irradiating UV thereon, and electroless plating, and is described in more detail as follows.

The solution is obtained by dissolving a catalyst precursor of an organic or inorganic compound including a group VIII B or a group I B metal, and a photoinitiator in solvent, and then mixing the resultant with a reactive monomer and a reactive oligomer while stirring to provide a catalyst precursor composition. Preferably, a vessel for mixing the components of the catalyst precursor composition can be three neck round bottom flask made of heat resistant glass, for example Pyrex glass. Because a metal stirrer can be corroded by the catalyst precursor, a Teflon (polytetrafluoroethylene) stirrer is preferable.

After preparing the catalyst precursor composition, the composition can be printed on a base material according to the suitable method. The printing method is not specifically limited, but inkjet printing, gravure printing, flexo printing, and screen printing, etc. are preferable. Based on the viscosity of the catalyst precursor composition, an optimal printing method can be selected. At a temperature of 25° C., a well-known printing ink has a suitable viscosity of 1 to 100 cps for inkjet printing, 30 to 300 cps for gravure printing, 50 to 500 cps for flexo printing, and 1000 to 5000 cps for screen printing.

The base material can be a material having sufficient transparency to visible light, and a surface that can be easily printed with the catalyst precursor composition, but it is not particularly limited. The shape of the base material can be flat or it may have a curved surface. The thickness of the base material is not particularly limited. Examples of the base material include glass, polyester, polystyrene, poly (methyl)methacrylate, polycarbonate, polypropylene, and polysulfone. Because the base material is heated and undergoes electroless plating after printing of the catalyst precursor composition, it should have a good heat resistance and low moisture absorption. Thus, polyester is preferable.

The solvent in the catalyst precursor composition is evaporated by heating the base material simultaneously with or shortly after printing. In the process of the evaporation, the catalyst precursor ion ($M^{n+}$) dissolved in the solvent moves to the surface layer of the composition in a considerable amount.

The base material is irradiated with UV when or after heating the catalyst precursor composition. The UV irradiation causes the photoinitiator to be dissociated to radicals which initiate a cross-linking reaction with the reactive monomer and the reactive oligomer. With the cross-linking reaction, the catalyst precursor ion ($M^{n+}$) is reduced to catalyst metal ($M^0$) which can function as a catalyst for electroless plating. Although the UV is irradiated over different periods of time depending on the composition of the catalyst precursor composition, the UV is irradiated for 1 to 3 minutes. In this condition, energy density of the U.V ranges from 1500 to 4500 m J/cm$^2$.

When the catalyst precursor ion ($M^{n+}$) is reduced to the element state ($M^0$), the group VIII B or group I B metal shows its unique color on the surface of the base material. Palladium shows silver gray.

After UV irradiation, the base material is immersed in an electroless plating solution. The electroless plating is performed by a generic electroless plating method, but preferables are nickel electroless plating and copper electroless plating. In a preferred embodiment of the present invention, the solution for nickel electroless plating preferably contains 16.5-18.5 g/L of $NiSO_4$, 29-31 g/L of $NaC_6H_5O_7$, 8.9-9.1 g/L of $NaC_2H_3O_2$, 87-89 g/L of $NaH_2PO_2$, and 3.7-3.9 g/L of KOH. The solution for copper plating can preferably contain 4.5-5.5 g/L of $CuSO_4$, 7-8 g/L of NaOH, 2-3.5 g/L of HCHO, and 30-36 g/L of EDTA.

The electroless plating reaction is usually initiated 2 to 5 minutes after immersion, although the initiation reaction is somewhat different depending on the kind of plating solution. Immersion of the base material in the electroless plating solution for about 30 minutes produces a plated metal layer with a thickness in the order of micrometers on the lattice pattern. Because the electroless plating reaction only occurs on the catalyst, the metal layer obtained by electroless plating is only on the printed part. The metal layer is in a lattice pattern, and thus has transparency and conductivity.

The EMI shielding material of the present invention has a laminated structure of a base material, a UV curable layer, and a plating layer from bottom to top. In general, the base material can preferably be a transparent material such as glass which is widely used in plasma display filters.

As described in the above, the catalyst precursor composition contains the UV curable resin with excellent adhesiveness to the base material, thereby eliminating the need for a pre-treatment step on the base material, to provide an easy and simple preparing method of an EMI shielding material.

In addition, the present invention provides a PDP filter comprising the EMI shield film obtained by the present invention, a near infrared ray shield film (NIR film), an anti-reflection coating film (AR film), a Neon-cut layer, a color correction layer, and a black layer.

The present invention also provides a plasma display panel containing the plasma display filter.

FIG. 1 is a drawing of the plasma display panel according to an embodiment of the present invention. The plasma display panel of the present invention will now be described more fully with reference to FIG. 1. The plasma display is equipped with a case 11 for displaying a picture, an operating circuit substrate 12 equipped with electric elements for operating the panel on the back of the case 11, a panel assembly 13 showing red, green, and blue, a plasma display filter 14 equipped on the front of the panel assembly 13, and a cover 15 for accepting the plasma display panel 11, the operating circuit substrate 12, the panel assembly 13, and the plasma display filter 14.

Figure 2:
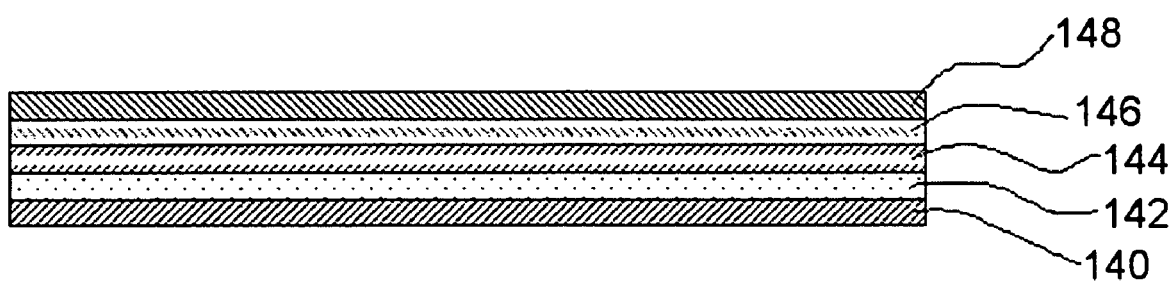
FIG. 2 is an enlarged sectional view of a PDP filter of the PDP shown in FIG. 1.

FIG. 2 is an enlarged sectional view of the plasma display filter 14 shown in FIG. 1. The plasma display filter has a laminated structure of several functional films on a transparent base material. With reference to FIG. 2, the plasma display filter 14 has a laminated structure of a color correction film 142, an EMI shield film 144, a near infrared ray shield film 146, and an anti-reflection film 148 on a transparent base material 140.

In the PDP filter 14, the near infrared ray shield film 146 includes a near infrared ray absorption film in which a polymer mixed with a near infrared ray absorption dye is coated on the transparent base material 140.

The PDP of the present invention includes an EMI shield filter including an EMI shielding material on an upper part of the panel assembly shown in FIG. 2. Accordingly, the present invention can reduce the production cost of a PDP.

Hereinafter, the present invention is described in more detail through examples. However, the following examples are only for the understanding of the present invention, and the present invention is not limited by the following examples.

EXAMPLES

Example 1

A. Preparation of the Catalyst Precursor Composition

A solution was obtained by dissolving 15 g of palladium acetate and 35 g of Irgacure 184(Ciba) in 400 g of methylethylketone. While stirring the solution, 300 g of tripropylene glycol diacrylate and 100 g of pentaerythritol triacrylate as a reactive monomer were added. After homogenizing the solution, 600 g of aliphatic urethane acrylate (Ebecryl 264, SK-ucb) as a reactive oligomer was added to the mixture solution, which was then stirred to become a homogenized solution to provide a catalyst precursor composition with a viscosity of 298 cps at room temperature.

B. Printing of the Catalyst Precursor Composition

According to the Gravure printing method, the catalyst precursor solution was printed on a polyester base material (SH34, SKC) in a rectangular lattice pattern where the lattice had a line width of 30 µm and an interval of 300 µm. Shortly after the solvent was dried at 80° C., for 1 minute, the base material was irradiated with a UV lamp. After about 2 minutes, the catalyst precursor solution was cured to a solid phase with the silver gray color of palladium.

C. Electroless Plating

The base material irradiated with UV was immersed in a Nickel plating solution at a temperature of 50° C. After about 5 minutes, hydrogen gas was generated on the surface of the printed pattern, which showed the initiation of the electroless Nickel reduction reaction. After about 30 minutes more, a Nickel layer of 6 µm in thickness was selectively formed to the pattern surface. As a result of a Nichiban tape test, the adhesiveness of the electroless Nickel layer to the base material was found to be 99/100. The manufactured transparent EMI shielding material had a surface resistance of 120 Ω/sq., with light transmittance of 78%.

Example 2

A. Preparation of the Catalyst Precursor Composition

A solution was obtained by dissolving 20 g of palladium acetylacetonate, 30 g of Irgacure 184(Ciba), and 5 g of Irgacure TPO(Ciba) in 400 g of chloroform. While stirring the solution, 200 g of 1,6-hexanediol diacrylate, 250 g of dipropylene glycol diacrylate, 150 g of triethylene glycol diacrylate, and 300 g of octyl/decyl acrylate as a reactive monomer were added. After homogenizing the solution, 100 g of polyester acrylate (CN2200, Sartomer) as a reactive oligomer were added to the mixture solution, which was then stirred to become a homogenized solution to provide a catalyst precursor composition with a viscosity of 4.1 cps at room temperature.

B. Print of the Catalyst Precursor Composition

The catalyst precursor solution was poured into a hollow ink cartridge for inkjet printing, which was then installed in an inkjet printer. The printer and ink cartridge were a Stylus 980 printer and a T003 Ink Cartridge, manufactured by Epson. A computer was used to make a rectangular lattice pattern with a line width of 40 µm and a line interval of 400 µm using the AutoCAD 2002 program of Autodesk. The catalyst precursor solution was printed on a polyester base material in the lattice pattern by connecting the computer and the printer. Shortly after the solvent was dried at 65° C., for 1 minute, the base material was irradiated with a UV lamp. The UV was irradiated using optical fiber. After about 1 minute, the catalyst precursor solution was cured to a solid phase with the silver gray color of palladium.

C. Electroless Plating

The polyester base material irradiated with UV was immersed in a Copper plating solution at a temperature of 46° C. After about 5 minutes, the plating reaction was initiated on the pattern surface. After about 30 minutes more, a Copper layer of a thickness of 1.5 µm was selectively adhered to the pattern surface. As a result of a Nichiban tape test, the adhesiveness of the electroless Copper layer to the base material was found to be 99/100. The manufactured transparent EMI shielding material had a surface resistance of 15 Ω/sq., with light transmittance of 78%.

Measurement

The viscosity of the catalyst precursor solution was measured with a DV-II+ viscometer manufactured by Brookfield. The surface resistance and light transmittance were measured with a Guardian232-1000 Surface Resistivity Meter manufactured by Guardian, and a HR-100 Transmittance Reflectance Meter manufactured by Murakami Color Research Laboratory, respectively. The adhesiveness of the electroless plated metal layer to the base material was measured by performing a Nichiban tape test according to JIS D0202.

Electroless Plating Solution

A Nickel electroless plating solution was prepared in the example, and a Copper electroless plating solution was purchased from Cuposit 250™ (Shipley). The electroless plating solutions had the following compositions and conditions.

Nickel Electroless Plating Solution:

16.5-18.5 g/L of NiSO$_4$; 29-31 g/L of NaC$_6$H$_5$O$_7$; 8.9-9.1 g/L of NaC$_2$H$_3$O$_2$; 87-89 g/L of NaH$_2$PO$_2$; 3.7-3.9 g/L of KOH. Temperature: 47-53° C.

Copper Electroless Plating Solution (Cuposit 250™)

4.5-5.5 g/L of CuSO$_4$; 7-8 g/L of NaOH; 2-3.5 g/L of HCHO; 30-36 g/L of EDTA. Temperature: 43-49° C.

According to the examples in which the catalyst precursor composition of the present invention was printed on a base material to produce a pattern, which was dried, irradiated with U.V., and then had electroless plating performed thereto, the present invention provided a pattern of metals such as Nickel and Copper plated on only the pattern without an additional pre-treatment of the base material, thereby easily preparing the EMI shielding material. In addition, the EMI shielding material had good surface resistance and light transmittance.

What is claimed is:

1. A method comprising:
   irradiating a catalyst precursor composition with UV irradiation, wherein the catalyst precursor composition comprises:
   (a) a reactive oligomer which has acrylate or methacrylate as a functional group, and a molecular weight ranging from 500 to 5000;
   (b) a reactive monomer which has acrylate or methacrylate as a functional group, and a molecular weight ranging from 100 to 600;
   (c) α-hydroxyketone as a photoinitiator;
   (d) a catalyst precursor for electroless plating which is an organic compound or an inorganic compound including a group VIII B metal or a group I B metal; and
   (e) a solvent selected from the group consisting of chloroform, acetonitrile, methylethylketone, ethylacetate, and mixtures thereof; and
   reducing the metal of the catalyst precursor organic compound or inorganic compound to form a catalyst for electroless plating.

2. The method of claim 1, wherein the (a) reactive oligomer is one selected from the group consisting of urethane acrylate, urethane diacrylate, urethane triacrylate, urethane methacrylate, epoxy acrylate, epoxy diacrylate, polyester acrylate, acrylic acrylate, and mixtures thereof.

3. The method of claim 1, wherein the (b) reactive monomer is one selected from the group consisting of isobomyl acrylate, octyl acrylate, decyl acrylate, 1,6-hexanediol diacrylate, dipropylene glycol diacrylate, tripropylene glycol diacrylate, triethylene glycol diacrylate, tetraethylene glycol diacrylate, ethoxylated neopentyl glycol diacrylate, propoxylated neopentyl glycol diacrylate, 2-phenoxyethyl acrylate, propoxylated glyceryl triacrylate, ethoxylated trimethyloipropane triacrylate, pentaerytbritol triacrylate, and mixtures thereof.

4. The method of claim 1, wherein the (d) catalyst precursor for electroless plating is a salt of an organic compound including a carbonyl group or an olefin group, and Pd$^{2+}$.

5. The method of claim 4, wherein the salt of the organic compound is one selected from the group consisting of palladium acetate, palladium trifluoroacetate, palladium oxalate, palladium acetylacetonate, and mixtures thereof.

* * * * *